(12) United States Patent
Baillin et al.

(10) Patent No.: US 8,981,544 B2
(45) Date of Patent: Mar. 17, 2015

(54) PACKAGING STRUCTURE OF A MICRO-DEVICE INCLUDING A GETTER MATERIAL

(75) Inventors: Xavier Baillin, Crolles (FR); Christine Ferrandon, Sassenage (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/285,289

(22) Filed: Oct. 31, 2011

(65) Prior Publication Data

US 2012/0112334 A1    May 10, 2012

(30) Foreign Application Priority Data

Nov. 9, 2010  (FR) ...................... 10 59248

(51) Int. Cl.
  *H01L 23/20*   (2006.01)
  *H01L 21/322*  (2006.01)
  *H01L 23/26*   (2006.01)
  *H01L 23/31*   (2006.01)
  *B81B 7/00*    (2006.01)

(52) U.S. Cl.
  CPC .............. *H01L 23/26* (2013.01); *H01L 23/315* (2013.01); *B81B 7/0038* (2013.01); *H01L 2924/0002* (2013.01)
  USPC .......................................... 257/682; 438/476

(58) Field of Classification Search
  CPC .................... H01L 23/564; H01L 23/26
  USPC ................... 438/456, 682, 680, 787
  See application file for complete search history.

(56) References Cited

U.S. PATENT DOCUMENTS

| | | | |
|---|---|---|---|
| 4,769,345 A | | 9/1988 | Butt et al. |
| 5,491,361 A | * | 2/1996 | Stupian et al. ............... 257/680 |
| 6,062,461 A | * | 5/2000 | Sparks et al. ............. 228/123.1 |
| 7,687,304 B2 | * | 3/2010 | Carlson et al. ................. 438/69 |
| 8,039,950 B2 | * | 10/2011 | Oldsen et al. ................ 257/704 |
| 8,558,364 B2 | * | 10/2013 | Summers ..................... 257/682 |
| 2003/0052392 A1 | | 3/2003 | Amiotti |
| 2004/0087043 A1 | * | 5/2004 | Lee et al. ........................ 438/6 |
| 2004/0099917 A1 | * | 5/2004 | Greathouse et al. .......... 257/414 |
| 2004/0259325 A1 | * | 12/2004 | Gan ............................. 438/456 |

(Continued)

FOREIGN PATENT DOCUMENTS

| | | |
|---|---|---|
| EP | 1 412 550 B1 | 3/2009 |
| EP | 2 141 117 A1 | 1/2010 |

(Continued)

OTHER PUBLICATIONS

French Preliminary Search Report issued Jun. 24, 2011 in French Patent Application No. 1059248 (with English translation of category of cited documents).

*Primary Examiner* — David Zarneke
(74) *Attorney, Agent, or Firm* — Oblon, McClelland, Maier & Neustadt, L.L.P.

(57) ABSTRACT

A packaging structure including at least one cavity wherein at least one micro-device is provided, the cavity being bounded by at least a first substrate and at least a second substrate integral with the first substrate through at least one bonding interface consisting of at least one metal or dielectric material, wherein at least one main face of the second substrate provided facing the first substrate is covered with at least one layer of at least one getter material, the bonding interface being provided between the first substrate and the layer of getter material.

20 Claims, 3 Drawing Sheets

(56) References Cited

U.S. PATENT DOCUMENTS

| | | |
|---|---|---|
| 2005/0067718 A1* | 3/2005 | Frischknecht ................ 257/787 |
| 2005/0085053 A1 | 4/2005 | Chen et al. |
| 2005/0170547 A1* | 8/2005 | Patel et al. ..................... 438/51 |
| 2006/0283546 A1 | 12/2006 | Tremel et al. |
| 2007/0026559 A1* | 2/2007 | Haluzak et al. ................ 438/50 |
| 2010/0003789 A1 | 1/2010 | Caplet et al. |
| 2010/0178419 A1 | 7/2010 | Baillin |
| 2010/0193215 A1 | 8/2010 | Baillin |
| 2011/0079425 A1 | 4/2011 | Baillin et al. |
| 2011/0079889 A1 | 4/2011 | Baillin et al. |
| 2014/0111947 A1* | 4/2014 | Henniger et al. ............. 361/728 |

FOREIGN PATENT DOCUMENTS

| | | |
|---|---|---|
| FR | 2 922 202 A1 | 4/2009 |
| WO | WO 2009/087284 A1 | 7/2009 |

* cited by examiner

PACKAGING STRUCTURE OF A MICRO-DEVICE INCLUDING A GETTER MATERIAL

TECHNICAL FIELD

This invention relates to the field of structures for packaging micro-devices including getter materials used for absorbing and/or adsorbing gases in a closed environment.

The invention is in particular applicable to packaging of micro-devices including one or more microsystems, for example of the MEMS (electromechanical microsystems) and/or NEMS (electromechanical nanosystems) type or of the infrared detector type, such as micro-bolometers.

The invention more particularly relates to a structure for hermetically packaging under a controlled atmosphere resonating MEMS type micro-devices.

STATE OF PRIOR ART

Some microsystems such as those of MEMS and/or NEMS type, or infrared micro-detectors, require to be packaged in a cavity under controlled atmosphere (type of gas and pressure within the cavity) to be in a good working order.

The technology used theretofore to achieve such packaging consists in first making these microsystems collectively on a first silicon substrate (wafer) with a thickness of several hundred micrometers. Each of the microsystems is packaged in a cavity obtained by transferring and hermetically sealing a cap, for example formed by a second silicon or glass substrate with also a thickness of several hundred micrometers, onto the first substrate. The second substrate is provided with hollows made collectively, and during the assembly between the two substrates, the microsystems are arranged in these hollows forming the cavities. After this assembly, one of the two substrates may be thinned to a minimum thickness of about 50 micrometers in order to achieve technological operations such as the realization of vias through the thinned substrate. The non-thinned substrate is thus used as mechanical handle for the assembly.

This hermetic assembly between the first and the second substrates and forming the cavities for packaging the microsystems enables in particular the gas leaks to be controlled between the inside of cavities and the outside environment. Adding non evaporable getters (NEG) into the cavities, for example as portions of getter material provided in the cavities, enables the atmosphere within the cavities to be controlled.

Making the portions of getter material requires to implement technological operations of deposition and photolithography etching in order to shape the portions of getter material in two dimensions, in the plane of both substrates. One alternative can consist in discretely depositing the getter directly in the desired form by a stencil, through a hard mask on the first substrate, near the microsystems or on the cap. A second alternative can consist in depositing the getter by a lift-off process on a photoresist resin film previously shaped by photolithography. US 2003/052392 A1 describes an example of discretized getter material, forming several distinct portions of getter material being deposited in difference cavities sealed by the cap.

In any case, these shaping steps of the getter material represent a significant cost in making packaging structures. Furthermore, the implementation of these steps presents a risk towards the getter material because of the chemical compatibility thereof with the product used for making this operation for discretizing the getter material.

It is also known to produce an encapsulation via the deposition of one or more thin layers to achieve the cap, as described for example in EP 2 141 117 A1. A getter material is also integrated to form the first layer of encapsulation. Such a process has the drawback of involving the creation of openings through the cap to remove the sacrificial material on which the thin film(s) have been deposited. Moreover, in this method, it is the backside (that is the side of the getter material that was deposited against the sacrificial material) of the layer of getter material which is exposed in the cavity, which does not allow for example to use a temperature adjustment sublayer of the getter material. Finally, this process also involves the exposure of the getter material, during the liberation of the cavity, to oxidizing gas atmosphere (with a temperature between 250° C. and 300° C.) for several minutes, which can degrade the ability of the getter material to pump gas.

DESCRIPTION OF THE INVENTION

An object of the present invention is to provide a new type of structure for packaging one or more micro-devices, including a getter material and without the drawbacks of packaging structures of the prior art.

For this purpose, the present invention provides a packaging structure including at least one cavity wherein at least one micro-device is provided, the cavity being bounded by at least a first substrate and at least a second substrate integral with the first substrate through at least one bonding interface consisting of at least one metal or dielectric material, wherein at least one main face of the second substrate provided facing the first substrate is covered with at least one layer of at least one getter material, the bonding interface being provided between the first substrate and the layer of getter material.

By "covered" it is meant that said main face of the second substrate provided facing the first substrate is fully or almost fully covered with at least said layer of at least one getter material.

Therefore, a structure making a packaging of one or more micro-devices at the substrate level ("Wafer Level Packaging") is provided, that is the cap, or cover, of which is formed by transferring a substrate, and in which a layer of getter material is continuously or almost continuously deposited on a main face of the substrate the function of which may be to be used as a cap.

The second substrate may form a continuous cap, that is it does not include holes (or openings) made therethrough, especially through its main faces, unlike structures of prior art including caps formed by deposits of thin layers on a sacrificial material and in which openings are necessarily made through the caps to remove this sacrificial material. Thus, the cap may have a thickness more than or equal to around 50 μm.

Unlike packaging structures of prior art, the layer of getter material thus extends at the bonding interface between both substrates, which has many advantages in particular for making the bonding interface which consists of at least one metal, that is the getter material.

Indeed, the getter material which is a metal material, is here compatible from the material point of view with the one(s) of the bonding interface, ensuring a good mechanical behaviour of the structure and a good tightness of the cavity formed in the packaging structure. The deposition of a metal on the getter material will result in a strong mechanical bond between these two metallic materials, either by the formation of intermetallic compounds at the interface, or by the formation of a metallic solid solution, or to using the Van Der Waals forces when the two metallic materials have no reactivity with each other in the operating conditions used (deposition and subsequent operations).

Such a packaging structure does not require the implementation of steps of shaping the getter material, which reduces the packaging structure cost.

Moreover, as compared with the packaging structures including discretized portions of getter material, the area of getter material exposed in the cavity is increased, which provides a larger pumping capacity, or, for the same desired pressure, relaxation of constraints to obtain the pumping capacity required to achieve this pressure.

In addition, this method allows exposing the front side of the layer of getter material in the cavity.

The first substrate and the second substrate of the packaging structure may have thicknesses equal to or higher than about 50 µm.

The second substrate may form a cap.

The cavity may be hermetically sealed.

The layer of getter material may have a thickness between about 100 nm and 2 µm.

The bonding interface may include at least two metal portions assembled one against the other. For example, the bonding interface may include at least two heat-compressed metal portions, that are bonded by heat compression. The heat compression carried out corresponds to an assembly between two solids contacted against each other or between a fusible material sandwiched between both solids, under a stress, for example under a pressure between about 1 MPa and 90 MPa, at a given temperature (for example between about 300° C. and 450° C.). At least one of the two metal portions may become liquid during the heat compression.

The bonding interface may include at least one heat-compressed dielectric portion against the layer of getter material or against at least one metal portion provided on the layer of getter material. A part of the layer of getter material may form the bonding interface. In this case, the bonding interface may include at least one metal portion and a dielectric portion, for example comprising semi-conductor oxide or nitride (such as $SiO_2$ and/or SiN), heat-compressed against each other. The thermal activation of the getter deposited onto the second substrate, being implemented during the assembling process, helps to create a getter/dielectric connection when the dielectric portion is made integral with the layer of getter material.

A bonding interface including a metal portion heat-compressed against the layer of getter material may also be designed. In this case, the metal portion may be composed of Ti and/or Zr and/or V.

The micro-device may be made in and/or on the first substrate.

The packaging structure may further include at least one layer of a material capable of changing the thermal activation temperature of the getter material, layer which is provided between the layer of getter material and said main face of the second substrate.

The second substrate may include at least one hole, or a trough, formed at said main face of the second substrate and that can bound at least one wall of the cavity.

The structure may further include at least one electrical contact made through the first substrate, forming an electrical connection between the cavity and a back face of the first substrate opposed to another face of the first substrate provided facing the second substrate, and/or an electrical connection between the back face of the first substrate and the getter material via the bonding interface.

It is thus possible to make a via passing through the first substrate and which is electrically connected to the getter. Such a via enables the getter to be biased to then play a role in the operation of the micro-device or even to electrically connect it to an electrical potential or to the ground.

A packaging structure is also provided including at least one cavity wherein at least one micro-device is arranged, the cavity being bounded by at least one first substrate and at least one second substrate made integral with the first substrate, wherein at least one main face of the second substrate provided facing the first substrate is covered, for example fully or almost fully, with at least one layer of at least one getter material. The bonding interface between the first substrate and the second substrate is thus formed by the getter material.

The invention also relates to a process for making a packaging structure of at least one micro-device, including at least the following steps of:

making a layer of at least one getter material, for example fully or nearly fully covering a main face of a second substrate, making a bonding interface consisting of at least one metal or dielectric material on a first substrate and/or on the layer of getter material, making the second substrate integral with the first substrate through the bonding interface, bounding a cavity formed between the first substrate and the second substrate, cavity in which the micro-device is provided, the bonding interface being provided between the first substrate and the layer of getter material.

The second substrate may form a continuous cap.

The step of making integral may be performed under a controlled atmosphere and such that the cavity is hermetically sealed.

The bonding interface may be made by forming at least a first metal portion on the layer of getter material and/or at least a second metal or dielectric portion on the first substrate, and wherein the step of making the second substrate integral with the first substrate may be achieved by implementing a heat compression of the first metal portion against the second metal or dielectric portion or of the second metal or dielectric portion against the layer of getter material.

The heat compression may be direct between the first portion and the second portion, or performed through a fusible solder or braze provided between the first metal portion and the second portion.

However, heat compression is generally to be distinguished from soldering or brazing, because it involves solid state diffusion mechanisms.

In this case, the first metal portion may be made by electrolytically depositing at least one metal material on the layer of getter material during which a current capable of growing said metal material flows in the layer of getter material. The electrolytic growth of the metallic material (eg Au—Sn if a solder metal is desired) can lead to the formation of a strong metal/metal interface. In addition, the electrolytic deposition of the metallic material may have a thickness of several microns (eg up to 10 microns) which allows to simultaneously define the height of the cavity and prevent to achieve before a hollow in the cap.

The process may further include, prior to making the layer of getter material, a step of making a layer of a material capable of changing the thermal activation temperature of the getter material on said main face of the second substrate, the layer of getter material being then made at least on said layer of material capable of changing the thermal activation temperature of the getter material. It is also possible to make two different and adjacent adjustment sub-layers, covered by a single getter material. In this case, the getter material has two areas of characteristics (pumping capacity and temperature of thermal activation) different. It is thus possible to integrate two large getters in the same cavity.

The process may further include, prior to making the layer of getter material, a step of making at least one hole or trough at said main face of the second substrate and bounding at least a wall of the cavity.

The process may further include, prior to making the second substrate integral with the first substrate, a step of making the micro-device in and/or on the first substrate.

The process may further include making at least one electrical contact through the first substrate, intended to form an electrical connection between the cavity and a back face of the first substrate opposed to another face of the first substrate intended to be provided facing the second substrate.

There is also provided a process for making a structure for packaging at least one micro-device, including at least the following steps of:
 making a layer of at least one getter material, for example fully or almost fully covering a main face of a second substrate,
 making the second substrate integral with the first substrate through the layer of getter material, bounding a cavity formed between the first substrate and the second substrate and wherein the micro-device is provided.

BRIEF DESCRIPTION OF THE DRAWING

The present invention will be better understood upon reading the description of exemplary embodiments only given as illustrative purposes and in no way limiting, making reference to the appended drawings wherein.

Identical, similar or equivalent parts in the different figures described hereinafter are given the same numerals so that switching from one figure to the other easier.

Different parts represented on the figures are not necessarily drawn to a uniform scale, so that figures are more easily readable.

The different possibilities (alternatives and embodiments) should be intended as being not exclusive one from the other and can be combined between each other.

DETAILED DESCRIPTION OF PARTICULAR EMBODIMENTS

Figure 1:
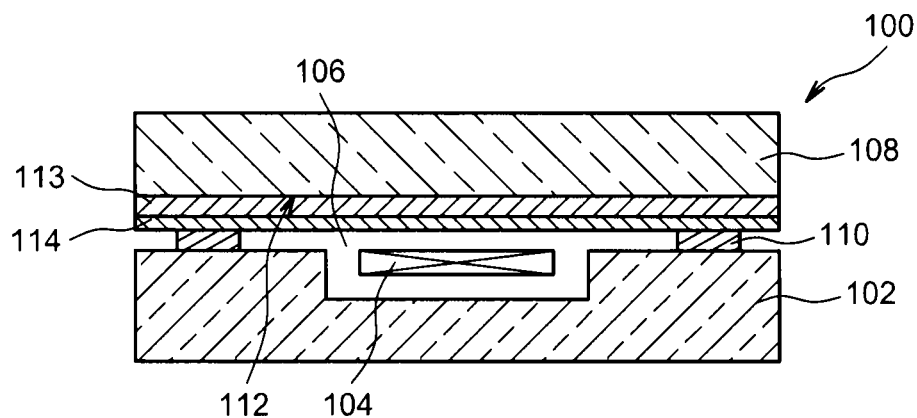
FIGS. 1 to 3 represent structures for packaging micro-devices, objects of the present invention, according to different embodiments.

FIG. 1 which represents a packaging structure 100 according to a first embodiment will be referred to.

The packaging structure 100 includes a first substrate 102, for example comprising a semi-conductor such as silicon, wherein a micro-device 104 is made, for example of the MEMS and/or NEMS type or of the infrared detector type, such as a micro-bolometer. The micro-device 104 is packaged into a cavity 106 formed between the first substrate 102 acting as a support to the micro-device 104, and a second substrate 108, also comprising a semi-conductor such as silicon or glass, and forming a cap. The substrates 102 and 108 are made integral with each other through a bonding interface 110 made as a sealing bead. This sealing bead consists for example of one or more fusible materials.

An insulating layer 113 comprising for example oxide or nitride when the second substrate 108 includes a semi-conductor or electrically conducting material, is made at a main face 112 of the second substrate 108. This insulating layer 113 obtained for example through oxidation of the main face 112 of the second substrate 108, fully covers this main face 112. The insulating layer 113 has for example a thickness between a few tens and a few hundreds of nanometers, for example between 10 nm and 900 nm. The insulating layer 113 is also fully covered with a layer of getter material 114, obtained for example by a full substrate deposition on the entire surface of the insulation layer 113. Thus, the entire main face 112 of the second substrate 108 provided facing the first substrate 102, that is on the cavity 106 side, is covered with a layer of getter material 114, here through the insulating layer 113 forming an electrical insulation between the layer of getter material 114 and the second substrate 108. The second substrate 108 here forms a continuous cap because no hole or opening passes through it.

Since a main face 112 of the second substrate 108 lying on the cavity 106 side is planar and the micro-device 104 is formed at a main face of the first substrate 102 facing the second substrate 108, the height of the cavity 106, that is the distance between the first substrate 102 and the layer of getter material 114, is thus defined by the thickness of the bonding interface 110.

In the case of an infrared detector type micro-device 104, the detection is advantageously carried out through the substrate 102 because the getter material of the layer 114 cannot pass the infrared radiation to be detected.

Figure 2:
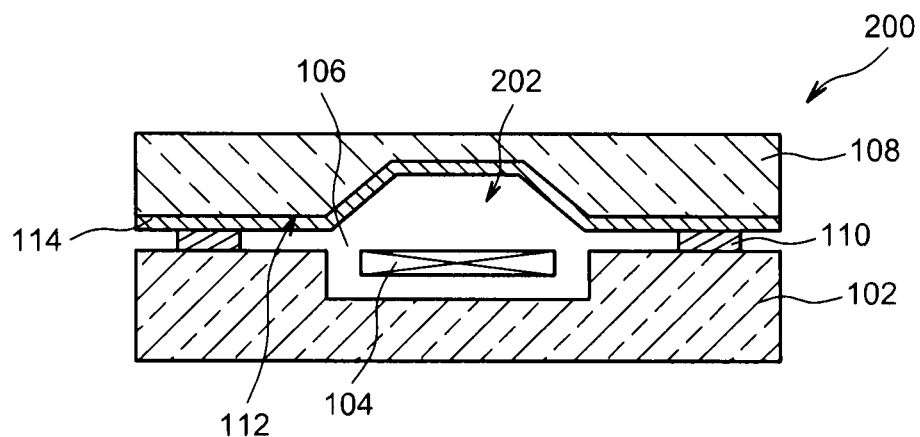

FIG. 2 which represents a packaging structure 200 according to a second embodiment will be referred to.

Different from the previously described structure 100, a hole, or trough 202 is formed in the second substrate 108, at the main face 112 of the second substrate 108. This trough 202 is formed in a part of the second substrate 108 intended to be provided in the cavity 106. This trough 202 is formed prior to depositing the layer of getter material 114 in order that the whole main face 112 and the walls of the trough 202 are covered with the layer of getter material 114. Moreover, different from the structure 100 according to the first embodiment, the packaging structure 200 does not include an insulating layer provided between the main face 112 of the second substrate 108 and the layer of getter material 114.

As compared with the first embodiment, such a trough 202 enables to increase the volume of the cavity 106 wherein the micro-device 104 is packaged. This trough 202 is only made through a part of the thickness of the second substrate 108 which consequently forms a continuous cap.

In an alternative, it would be possible for an insulating layer, for example similar to the previously described insulating layer 113, to be provided between the layer of getter material 114 and the second substrate 108 of the packaging structure 200.

Figure 3:
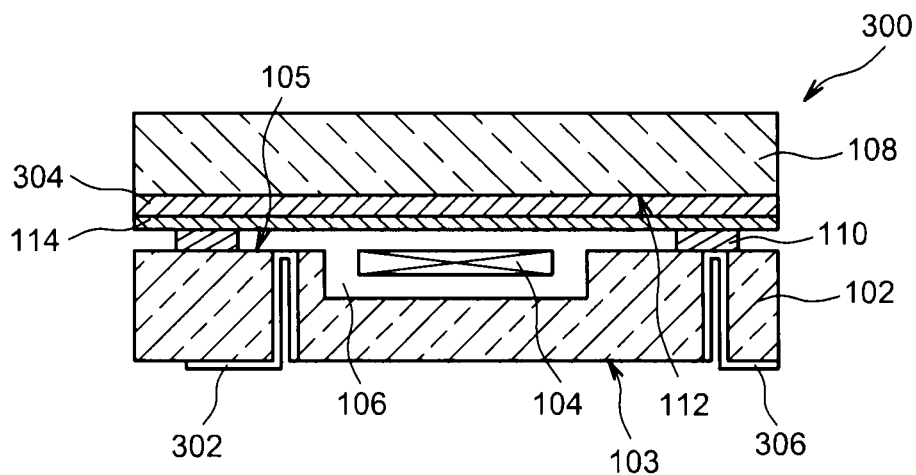

FIG. 3 which represents a packaging structure 300 according to a third embodiment will be referred to.

Different from the previously described structure 100, a through via 302 is formed through the first substrate 102, from a back face 103 of the first substrate 102 opposed to a front face 105 of the first substrate 102 at which the micro-device 104 is made. This through via 302 opens into the cavity 106 and is electrically connected to the micro-device 104, thus forming an electrical access to the micro-device 104 from the back face 103 of the first substrate 102. A via 306, electrically connected to the getter material 114 via the bonding interface 110, is made through the first substrate 102, and thus forms an electrical access to the getter material 114 from the back face 103 of the first substrate 102. Other vias, not represented and similar to the via 302 or via 306, may be formed through the first substrate 102. Such a via 302 enables to perform an electrical contact of the micro-device 104 at the back face 103 of the first substrate 102, but also to make a stack of the packaging structure 300 on an electronic circuit through fusible material based-microbeads ("flip-chip"), a part of this via 302 being able to form a wetting surface to a fusible material microbead. The same is true for the via 306. Once again, the second substrate 108 forms a continuous cap.

The packaging structure 300 also includes, between the second substrate 108 and the layer of getter material 114, a layer 304 for adjusting the thermal activation temperature of the getter material of the layer 114. This layer 304 is composed of one or more metal materials, for example composed of Cu and/or Ni and/or Pt and/or Ag and/or Ru and/or Cr and/or Au and/or Al, and enables to modulate the temperature at which the getter material of the layer 114 reacts with the atmosphere of the cavity 106. Thus, this layer 304 enables to decrease the thermal activation temperature of this getter material such that it is for example between about 275° C. and 425° C. according to the metal type of the adjusting layer 304 and the getter material type of the layer 114. The use of such layer for adjusting the temperature of thermal activation is possible due to the fact that the rear surface of the getter material layer 114 is disposed against the adjusting layer 304.

The thickness of the layer 304 is for example between about 50 nm and 500 nm. The adjusting layer 304 may have a thermal expansion coefficient between about $5.10^{-6}/°$ C. and $23.10^{-6}/°$ C. and a ratio of its making temperature (temperature at which the layer 304 is deposited) to its melting temperature substantially between about 0.1 and 0.3. The adjusting layer 304 is for example deposited through evaporation. Other characteristics related to such a layer 304 for adjusting the temperature are for example described in WO 2009/087284.

In each of the packaging structures 100, 200 and 300, the layer of getter material 114 fully covers the second substrate 108, whether through one or more other layers or not, and is present both in the cavity 106, at the cap, and against the bonding interface 110, between the bonding interface 110 and the second substrate 108.

It will now be described, in conjunction with FIGS. 4A to 4E, an exemplary process for making the packaging structure 100 previously described.

First, the insulation layer 113 is made at the entire main face 112 of the second substrate 108. This insulating layer 113 may be obtained by oxidizing, for example thermal oxidizing, or nitridizing the second substrate 108 at its main face 112, and has for example a thickness between about a few tens of nanometers and a few hundreds of nanometers.

Figure 4A:
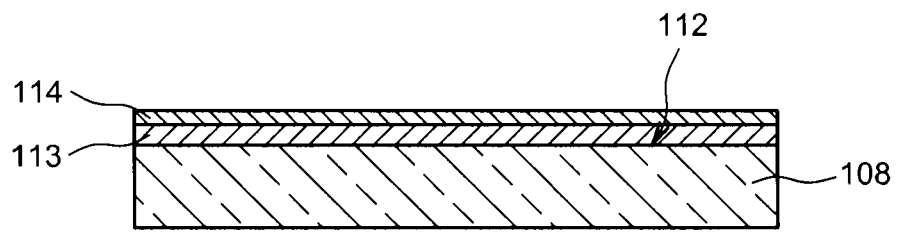
FIGS. 4A to 4E represent steps of a process for making a structure for packaging at least one micro-device, also the object of the present invention, according to a particular embodiment.

The layer of getter material 114 is then formed by a fully substrate deposition against the insulation layer 113, so that the entire main face 112 of the second substrate 108 is covered with the layer of getter material 114 through the insulating layer 113 (FIG. 4A). The thickness of the layer of getter material 114 is for example between about 100 nm and 2 µm.

Figure 4B:
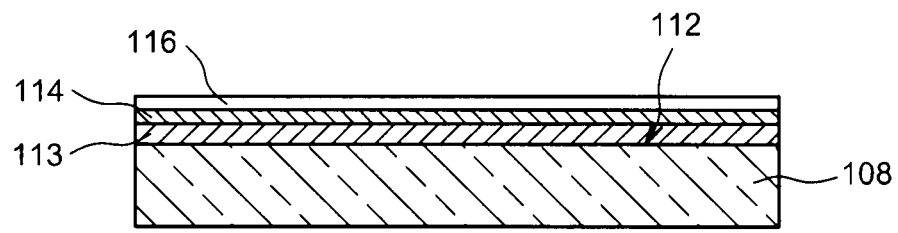

Optionally, on the layer of getter material 114, a protecting layer 116 may be formed in a dry manner, composed of an oxide or nitride of the getter material of the layer 114 (FIG. 4B). This protecting layer 116 may be achieved by an oxidation or nitridation implemented under a dioxygen and/or dinitrogen dry atmosphere. By "dioxygen and/or dinitrogen dry atmosphere", it is meant an atmosphere under a low or zero partial pressure of water vapour (for example lower than about $10^{-5}$ mbar).

Such a protecting layer 116 can reversibly absorb and/or adsorb gaseous molecules, for example those of ambient air, thus shielding the entire surface of the getter material of the layer 114 from any alteration by these gaseous molecules. The molecules absorbed and/or adsorbed by the protecting layer 116 could be desorbed by the subsequent implementation of a mere offgassing. Therefore, it is possible afterwards for the getter material to be exposed to ambient air without being altered by gases of ambient air.

As compared to an oxidation of the getter material occurring by exposing the getter material to ambient air, the oxidation and/or nitridation performed in a dry manner, that is performed in a closed environment including dry oxygen and/or dry dinitrogen, do not diffuse hydrogen molecules in the getter material. Thus, no offgassing to specifically remove these hydrogen molecules is necessary before the cavity 106 is formed.

This protecting layer 116 also enables to increase the pumping capacity of the getter material of the layer 114 with respect to a getter material not protected and exposed to ambient air. Finally, the getter material thus protected may be thermally activated from a lower activation temperature, for example lower by about 20° C. to 30° C., than the activation temperature of a getter material not protected and exposed to ambient air. Making the protecting layer 116 is for example implemented at a temperature between about 50° C. and 120° C., at a pressure for example at least equal to about $10^{-2}$ mbar, for a period of time of a few minutes, for example between about 1 min and 10 min. A protecting layer 116 is obtained the thickness of which is about a few nanometers, for example between about 1 nm and 10 nm.

A protecting layer 116 including chromium may also be contemplated. Indeed, chromium has the propensity to be naturally passivated at ambient air through formation of a chromium oxide layer. Depositing a chromium protecting layer with a thickness between about 10 nm and 50 nm results in obtaining a very columnar microstructure thus capable of diffusion of the getter 114 through grain boundaries of the chromium layer. Besides, this diffusion is favoured from the thermodynamic point of view.

Figure 4C:
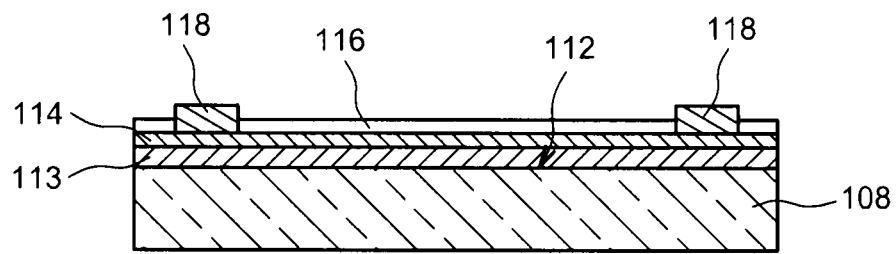

As represented in FIG. 4C, in the layer 114 of getter material, portions 118 of material, for example a metallic material, are then made which will then promote growth of the material intended to form the sealing bead, that is the bonding interface between the first substrate 102 and the second substrate 108.

To do so, first, a photolithography is made of the protecting layer 116 defining the locations of the portions of material 118, according to the desired boundary of the cavity 106. A resin based-mask, not represented, the pattern of which corresponds to that of the sealing bead, is thus made on the protecting layer 116. Then, the protecting layer 116 is stripped through etching, for example through ion beams (I-beam etching), at the locations previously defined for forming the portions 118.

Then, a diffusion barrier is deposited at the locations of the portions 118, for example as a nickel or tungsten nitride based-layer. When the barrier layer includes tungsten nitride, the thickness of this layer may be a few tens of nanometers, and for example between about 10 nm and 100 nm. When the barrier layer includes nickel, the thickness of this layer may be a few hundreds of nanometers, and for example between about 100 nm and 1 µm.

Then, a PVD (physical vapour deposition) of the material of the portions 118, for example gold, is performed on a thickness of a few tens of nanometers, for example between about 10 nm and 100 nm, at the locations defined by the previous photolithography step, in order to promote the subsequent growth of the material of the sealing bead (FIG. 4C). The resin mask thickness made to implement the previous photolithography step is sized so that flanks of openings in this mask are not covered with the material of the portions 118. For this, the resin mask has for example a thickness of a few microns, for example equal to about 10 μm. It is possible that two consecutive photolithography steps are implemented: a first one to strip the protecting layer 116, and a second one to etch the barrier layer and gold in order to keep only the portions 118.

Figure 4D:
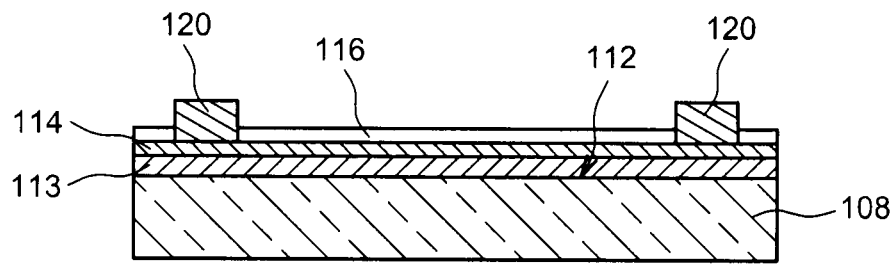

An electrolytic deposition, for example of the ECD (electrochemical deposition) type of the material intended to form the sealing bead is then performed on the diffusion barrier, at the locations defined by the portions 118 of material. This electrolytically deposited material is identical to the one of the portions 118, forming portions 120 of metal material which will be used to make the sealing bead (FIG. 4D). The metal of the portions 120 may be gold. The layer 114 of getter material is used as a current feeding layer for performing growth of this electrolytical deposit.

The presence of the protecting layer 116 is advantageous upon implementing such an electrolytical deposit because the surface of the protecting layer 116 is non-wetting toward the Au—Sn 29% at. alloy electrolytically deposited. Therefore, this alloy does not spread on the surface of the protecting layer 116 and remains on the areas defined by the portions 118.

It is also possible for the material of the portions 120 to be a Au—Sn 29% at. alloy (including 71% atomic gold and 29% atomic tin). In this case, the presence of the barrier layer under this material avoids a reactivity of this material with the getter material of the layer 114. However, it is possible to deposit this Au—Sn 29% at. alloy in the absence of the barrier layer. In such a case, it is preferable to deposit first gold, and then to deposit tin, the thickness of deposited gold being selected so that it does not completely melt upon assembling the first substrate 102 with the second substrate 108.

When the protecting layer 116 includes chromium, it is possible for the portions 118 and then the portions 120 to be made onto the protecting layer 116, without locations being etched in the protecting layer 116.

After the portions 120 have been electrolytically deposited, the resin mask that has been used for this deposition is removed, for example with a solvent or any suitable product.

Figure 4E:
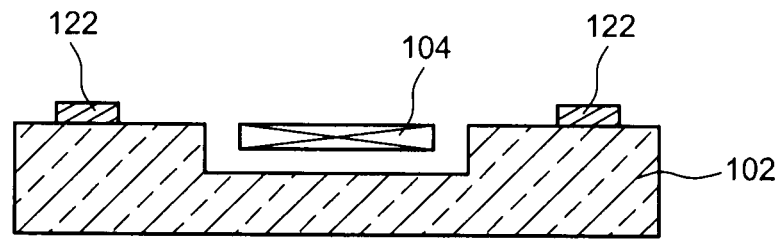

Parallel to previously described steps in connection with FIGS. 4A to 4D, the micro-device 104 is formed in the first substrate 102. Second metal portions 122, for example composed of the same metal or the same alloy as that of the portions 120, are made on the face of the first substrate 102, which face is intended to be provided facing the second substrate 108. These second portions 122 are made according to the same pattern as that of the portions 120 (FIG. 4E).

In an alternative, it is possible for these seconds portions 122 to include not an electrically conducting material as described above, but a dielectric material, for example a semiconductor oxide or nitride such as silicon. In this case, the second portions 122 may be directly heat-compressed against the layer of getter material 114 (the portions 120 previously described cannot be made on the layer of getter material 114).

Finally, both substrates 102 and 108 are assembled and made integral with each other by performing a heat compression of the second metal portions 122 against the metal portions 120, thus forming the sealing bead 110. This sealing may be performed under a controlled atmosphere in order to recover its controlled atmosphere (for example vacuum or under a particular gaseous atmosphere) in the cavity 106 wherein the micro-device 104 is packaged.

The portions 120 and 122 may be directly heat-compressed against each other. However, it is also possible for at least one fusible material to be provided between the portions 120 and 122 and the heat compression to be performed between the portions 120, 122 through this fusible material.

The packaging is then completed by performing a thermal activation of the getter material of the layer 114 by an annealing at a temperature for example between about 200° C. and 450° C. and selected depending on the getter material type. Besides the thermal activation of the getter material layer 114, this annealing also enables the protecting layer 116 to be "dissolved", that is the protecting layer 116 to be removed, resulting in the oxygen and/or nitrogen molecules present in the protecting layer 116 as oxide and/or nitride particles being absorbed by the entire getter material 114, which allows to recover an even getter material 114, here titanium-based.

When the portions 122 are dielectric material based and are directly made integral against the getter material, this thermal activation contributes creating a getter/dielectric bonding.

In an alternative of this manufacturing process, it is possible not to make the protecting layer 116. In such a case, a layer composed of a material of the portions 118, here gold, with a thickness equal to a few tens of nanometers (for example between about 10 nm and 100 nm) is directly deposited onto the layer of getter material 114. In such a case, after the photolithography step defining the locations of the portions 118, the electrolytical deposition is directly performed in order to form the metal portions 120. Then, the portions of the gold layer lying around the portions 120 are dry or wet-etched in order to develop the layer of getter material 114. In this alternative, a diffusion barrier may also be added such as the one previously described between the getter and the gold layer. It will then be necessary to strip off the getter 114 by etching gold and the diffusion barrier around the portions 120. The process is then completed by sealing both substrates 102 and 108 by heat compressing the metal portions 120 against the metal portions 122.

The above described structure 200 may be achieved by implementing steps substantially similar to those described above for making the structure 100, except that, prior to depositing the layer of getter material 114 and possibly prior to the oxidation layer 112, the hole 202 is made in the second substrate 108, for example through etching.

The above described structure 300 may be achieved by implementing steps substantially similar to those described above for making the structure 100, except that the vias 302 and 306 are then made after the first substrate 102 has been made integral with the second substrate 108. For example, the via 302 is achieved by first performing a photolithography of a resin mask and a DRIE (deep reactive ion etching) of the silicon of the substrate 102 with stop on a metal row of the substrate 102 which is connected to the micro-device 104. Then, an insulation of the vias 302 and 306 is performed by oxidation, for example of the CVD (chemical vapour deposition) type, of the walls etched into the substrate 102. Then, the via bottom is etched by a suitable etching. Metal layers used as a continuous bottom for a future electrochemical deposition in the via are deposited, for example through vapour physical type depositions (for example: deposition of a titanium layer followed by deposition of a copper layer). A photolithography on the back face 103 is then performed for electromechanically growing copper lines. Finally, the continuous bottom previously made is etched.

The invention claimed is:
1. A packaging structure, comprising:
at least one cavity wherein at least one micro-device is provided, the cavity being bounded by at least a first substrate and at least a second substrate integral with the first substrate through at least one bonding interface, wherein at least one main face of the second substrate facing the first substrate is covered with at least one layer of at least one getter material, the at least one bonding interface being in direct contact with both the first substrate and the at least one layer of at least one getter material, wherein the at least one bonding interface includes at least one dielectric portion and one first metal portion heat-compressed against the at least one layer of at least one getter material, such that the at least one dielectric portion and the one first metal portion are integral with the at least one layer of at least one getter material at the at least one bonding interface, and wherein the at least one layer of at least one getter material is directly exposed to the at least one cavity above the at least one micro-device.

2. The packaging structure according to claim 1, wherein the second substrate forms a cap.

3. The packaging structure according to claim 1, wherein the cavity is hermetically sealed.

4. The packaging structure according to claim 1, wherein the layer of getter material has a thickness between about 100 nm and 2 µm.

5. The packaging structure according to claim 1, wherein the bonding interface includes at least two metal portions heat-compressed against each other.

6. The packaging structure according to claim 1, wherein the micro-device is made in and/or on the first substrate.

7. The packaging structure according to claim 1, further including at least one layer of a material capable of changing the thermal activation temperature of the getter material, which layer is provided between the layer of getter material and said main face of the second substrate.

8. The packaging structure according to one of the preceding claims, wherein the second substrate includes at least one trough formed at said main face of the second substrate and bounding at least a wall of the cavity.

9. The packaging structure according to claim 1, further including at least one electrical contact made through the first substrate, forming an electrical connection between the cavity and a back face of the first substrate opposed to another face of the first substrate provided facing the second substrate and/or an electrical connection between the back face of the first substrate and the getter material via the bonding interface.

10. The packaging structure according to claim 1, wherein the at least one dielectric portion has a first side in direct contact with a first side of the one metal portion and a second side in direct contact with the first substrate.

11. The packaging structure according to claim 1, wherein the at least one bonding interface includes the at least one dielectric portion and the one first metal portion heat-compressed against at least one second metal portion provided on the at least one layer of at least one getter material.

12. A process for making a packaging structure of at least one micro-device, comprising:
making a layer of at least one getter material covering a main face of a second substrate;
making a bonding interface on a first substrate and/or on the at least one layer of getter material;
making the second substrate integral with the first substrate through the bonding interface, bounding a cavity formed between the first substrate and the second substrate, the cavity in which the at least one micro-device is provided, the bonding interface being provided between the first substrate and the at least one layer of getter material;

wherein the bonding interface includes at least one dielectric portion and one first metal portion heat-compressed against the at least one layer of getter material, such that the at least one dielectric portion and the one first metal are made integral with the at least one layer of getter material at the bonding interface; and wherein the layer of at least one getter material is directly exposed to the cavity above the at least one micro-device.

13. The process according to claim 12, wherein the step of making substrates integral is carried out under a controlled atmosphere and such that the cavity is hermetically sealed.

14. The process according to claim 12, wherein the bonding interface is made by forming an at least one second metal portion on the at least one layer of getter material, or the one first metal portion and the at least one dielectric portion on the first substrate, and wherein the step of making the second substrate integral with the first substrate is achieved by implementing a heat compression of the at least one second metal portion against the one first metal portion and at least one dielectric portion, or a heat compression of the one first metal portion and at least one dielectric portion against the at least one layer of getter material.

15. The process according to claim 14, wherein the at least one second metal portion is made by electrolytically depositing at least one metal material on the layer of getter material during which a current capable of growing said metal material flows in the layer of getter material.

16. The process according to claim 12, further including, prior to making the layer of getter material, a step of making a layer of a material capable of changing the thermal activation temperature of the getter material on said main face of the second substrate, the layer of getter material being then made at least on said layer of material capable of changing the thermal activation temperature of the getter material.

17. The process according to claim 12, further including, prior to making the layer of getter material, a step of making at least one trough at said main face of the second substrate and bounding at least one wall of the cavity.

18. The process according to claim 12, further including, prior to making the second substrate integral with the first substrate, a step of making the micro-device in and/or on the first substrate.

19. The process according to claim 12, further including making at least one electrical contact through the first substrate, intended to form an electrical connection between the cavity and a back face of the first substrate opposed to another face of the first substrate intended to be provided facing the second substrate.

20. The process according to claim 12, wherein the bonding interface includes the at least one dielectric portion and the one first metal portion heat-compressed against at least one second metal portion provided on the at least one layer of getter material.

* * * * *